United States Patent
Dong et al.

(10) Patent No.: US 11,210,169 B2
(45) Date of Patent: Dec. 28, 2021

(54) DATA STORAGE METHOD, APPARATUS, AND SYSTEM

(71) Applicant: Alibaba Group Holding Limited, Grand Cayman (KY)

(72) Inventors: Yuanyuan Dong, Hangzhou (CN); Shuzhan Wei, Hangzhou (CN); Yafei Zhao, Hangzhou (CN)

(73) Assignee: Alibaba Group Holding Limited, George Town (KY)

( * ) Notice: Subject to any disclaimer, the term of this patent is extended or adjusted under 35 U.S.C. 154(b) by 0 days.

(21) Appl. No.: 16/922,706

(22) Filed: Jul. 7, 2020

(65) Prior Publication Data

US 2020/0334106 A1    Oct. 22, 2020

Related U.S. Application Data

(63) Continuation of application No. PCT/CN2019/070582, filed on Jan. 7, 2019.

(30) Foreign Application Priority Data

Jan. 9, 2018 (CN) .......................... 201810020376.7

(51) Int. Cl.
*G06F 11/10* (2006.01)
*G06F 3/06* (2006.01)
*H03M 13/15* (2006.01)

(52) U.S. Cl.
CPC ........ *G06F 11/1068* (2013.01); *G06F 3/0619* (2013.01); *G06F 3/0631* (2013.01);
(Continued)

(58) Field of Classification Search
CPC .................................................. G06F 11/1068
(Continued)

(56) References Cited

U.S. PATENT DOCUMENTS 5,099,517 A  *  3/1992  Gupta .................... H04L 29/02
                                                                370/522
7,979,771 B2     7/2011  Margolus et al.
(Continued)

FOREIGN PATENT DOCUMENTS

| CN | 102681793 A | 9/2012 |
| CN | 105630423 A | 6/2016 |
| CN | 106662983 A | 5/2017 |

OTHER PUBLICATIONS

Translation of International Search Report dated Mar. 21, 2019, from corresponding PCT Application No. PCT/CN2019/070582, 2 pages.
(Continued)

*Primary Examiner* — Fritz Alphonse
(74) *Attorney, Agent, or Firm* — Lee & Hayes, P.C.

(57) ABSTRACT

Data storage method, apparatus, and system are disclosed. The data storage method includes: encoding a data block using an erasure coding to obtain corresponding multiple data fragments; separately writing the multiple data fragments to corresponding allocated storage nodes; and determining that writing of the data block is successful if a number of storage nodes to which data fragments is successfully written within a first defined time duration is greater than or equal to a defined value, wherein the defined value is greater than or equal to a number of data block fragments in the multiple data fragments and is less than or equal to a number of the multiple data fragments. As such, the latency of a data write can be reduced, and the performance stability can be improved when a storage node encounters a failure.

20 Claims, 6 Drawing Sheets

(52) U.S. Cl.
CPC .......... *G06F 3/0659* (2013.01); *G06F 3/0673* (2013.01); *H03M 13/154* (2013.01)

(58) Field of Classification Search
USPC .................. 714/764, 767, 761, 763, 768
See application file for complete search history.

(56) References Cited

U.S. PATENT DOCUMENTS

| | | | |
|---|---|---|---|
| 8,473,778 | B2 | 6/2013 | Simitci et al. |
| 8,713,405 | B2 | 4/2014 | Healey, Jr. et al. |
| 9,116,833 | B1 | 8/2015 | Rakitzis et al. |
| 9,280,416 | B1 | 3/2016 | Xin et al. |
| 9,378,084 | B2 | 6/2016 | Calder et al. |
| 10,014,881 | B2 | 7/2018 | Blaum et al. |
| 10,187,083 | B2 | 1/2019 | Calder et al. |
| 10,291,259 | B2 | 5/2019 | Anderson |
| 10,437,672 | B2 | 10/2019 | Baker et al. |
| 10,484,016 | B2 | 11/2019 | Wideman et al. |
| 10,536,167 | B2 | 1/2020 | Pavlov et al. |
| 2005/0240943 | A1* | 10/2005 | Smith ................ G06F 9/465 719/328 |
| 2006/0069800 | A1 | 3/2006 | Li |
| 2014/0380125 | A1* | 12/2014 | Calder ................ H03M 13/373 714/766 |
| 2014/0380126 | A1* | 12/2014 | Yekhanin ............ G06F 11/1076 714/766 |
| 2015/0019937 | A1 | 1/2015 | Baker et al. |
| 2015/0163280 | A1* | 6/2015 | Wu ....................... H04L 67/108 709/217 |
| 2015/0356027 | A1* | 12/2015 | Arbel ..................... G06F 13/00 710/308 |
| 2017/0228285 | A1 | 8/2017 | Merritt et al. |
| 2020/0133771 | A1* | 4/2020 | Goyal ................. H03M 13/154 |
| 2020/0250032 | A1* | 8/2020 | Goyal ................... G06F 3/0659 |

OTHER PUBLICATIONS

Translation of Written Opinion dated Mar. 21, 2019, from corresponding PCT Application No. PCT/CN2019/070582, 3 pages.
Extended European Search Report dated Sep. 9, 2021 for European Patent Application No. 19738610.5, 8 pages.

* cited by examiner

DATA STORAGE METHOD, APPARATUS, AND SYSTEM

CROSS REFERENCE TO RELATED PATENT APPLICATIONS

This application claims priority to and is a continuation of PCT Patent Application No. PCT/CN2019/070582 filed on 7 Jan. 2019, and is related to and claims priority to Chinese Application No. 201810020376.7, filed on 9 Jan. 2018 and entitled "Data Storage Method, Apparatus, and System," which are hereby incorporated by reference in their entirety.

TECHNICAL FIELD

The present disclosure relates to, but is not limited to, the field of data storage technologies, and particularly to data storage methods, apparatuses, and systems.

BACKGROUND

Current distributed storage systems increasingly use erasure coding (EC) technology for storing data. A Reed-Solomon (RS) class EC is used as an example, with a technical principle thereof being: dividing data into K data blocks, and using a redundant algorithm to check and encode the K data blocks to generate M parity blocks, where: when less than or equal to M blocks of K+M blocks are lost, data in the lost blocks can be restored. In order to ensure the reliability of storage, a distributed storage system would provide K+M blocks to K+M storage nodes for storage. In this way, even if a node fails, data restoration can be performed based on data that is stored in other nodes.

An implementation of EC in current distributed storage systems mainly includes: first writing data into three copies, and then converting the three copies into EC encoded data at the backend according to a defined strategy. However, this type of method has a problem of traffic amplification. Therefore, for some cases (for example, when data that is written is greater than or equal to 128 KB), EC encoding can be directly performed, without first writing into three copies, thereby avoiding traffic amplification. However, in this direct-write (Direct) EC scenario, if some storage nodes involved in a write process are abnormal resulting in a failure of guaranteeing that all storage nodes are successfully written, write attempts will continue to be performed until a timeout or write failure occurs. Data reconstruction is performed on a storage node associated with the timeout or write failure, and a write continues after the reconstruction is completed. In this way, a relatively large write delay and write failure rate will occur, resulting in a relative large fluctuation in direct-write EC delay, and unstable performance.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter. The term "techniques," for instance, may refer to device(s), system(s), method(s) and/or processor-readable/ computer-readable instructions as permitted by the context above and throughout the present disclosure.

Embodiments of the present disclosure provide data storage method, apparatus, and system, which can reduce a data writing delay and improve performance stability when a failure exists in a storage node.

In implementations, the present disclosure provides a data storage method, which includes:
  encoding a data block using an erasure coding to obtain corresponding multiple data fragments;
  separately writing the multiple data fragments to corresponding allocated storage nodes; and
  determining that writing of the data block is successful if a number of storage nodes to which data fragments is successfully written within a first defined time duration is greater than or equal to a defined value, wherein the defined value is greater than or equal to a number of data block fragments in the multiple data fragments and is less than or equal to a number of the multiple data fragments.

In implementations, after determining that the data block is successfully written, the method may further include: asynchronously rewriting data fragments that are not successfully written to storage nodes.

In implementations, the asynchronous rewriting data fragments that are not successfully written to the storage nodes may include:
  rewriting the data fragments to the storage nodes to which the data fragments were not successfully written;
  updating the number of storage nodes to which the data fragments are successfully written if the rewriting is successful; and
  performing a seal operation on the data block, marking the data block as read-only, and perform data reconstruction and recovery on the data block through a storage management node, if the rewriting fails.

In implementations, after separately writing the multiple data fragments to the corresponding allocated storage nodes, the method may further include:
  performing a seal operation on the data block and marking the data block as read-only if the number of storage nodes to which the data fragments are successfully written within the first defined time duration is less than the defined value;
  allocating a new data block, and determining a plurality of corresponding data fragments obtained after encoding the new data block using the erasure coding, wherein data content included in the new data block is identical to data content included by the data block marked as read-only; and
  separately writing the plurality of corresponding data fragments of the new data block to newly allocated storage nodes.

In implementations, after separately writing the multiple data fragments to the corresponding allocated storage nodes, the method may further include:
  determining that the writing of the data block fails if a number of storage nodes to which the data fragments are successfully written within a second defined time duration is less than the defined value, wherein the second defined time duration is greater than the first defined time duration.

In implementations, determining that the writing of the data block is successful if the number of storage nodes to which the data fragments is successfully written within the first defined time duration is greater than or equal to the defined value may include:
  determining that the writing of the data block is successful after data fragments that are not successfully written to the storage node are successfully written to allocated backup storage node(s), if the number of storage nodes to which the data fragments is successfully written within the first defined time duration is greater than or equal to the defined value.

In implementations, before encoding the data block using the erasure coding to obtain the corresponding multiple data fragments, the method may further include:

determining the following parameters: a number K of data block fragments obtained by encoding any data block using the erasure coding, a number M of check fragments obtained by encoding the any data block using the erasure coding, and a reliability parameter N in a process of writing the any data block, wherein K and M are positive integers, and N is an integer greater than or equal to 0 and less than or equal to M.

In implementations, the parameters may further include: a number of backup storage nodes.

In implementations, the present disclosure further provides a data storage apparatus, which includes:

an encoding module adapted to encode a data block using an erasure coding to obtain corresponding multiple data fragments;

a writing module adapted to separately write the multiple data fragments to corresponding allocated storage nodes; and a processing module adapted to determine that writing of the data block is successful if a number of storage nodes to which data fragments is successfully written within a first defined time duration is greater than or equal to a defined value, wherein the defined value is greater than or equal to a number of data block fragments in the multiple data fragments and is less than or equal to a number of the multiple data fragments.

In implementations, the processing module may be further adapted to asynchronously rewrite data fragments that are not successfully written to storage nodes after determining that the data block is successfully written.

In implementations, the processing module may be further adapted to perform a seal operation on the data block and mark the data block as read-only if the number of storage nodes to which the data fragments are successfully written within the first defined time duration is less than the defined value; allocate a new data block, and determine a plurality of corresponding data fragments obtained after encoding the new data block using the erasure coding, wherein data content included in the new data block is identical to data content included by the data block marked as read-only; and separately write the plurality of corresponding data fragments of the new data block to newly allocated storage nodes.

In implementations, the processing module may be adapted to determine that the writing of the data block is successful after data fragments that are not successfully written to the storage node are successfully written to allocated backup storage node(s), if the number of storage nodes to which the data fragments is successfully written within the first defined time duration is greater than or equal to the defined value.

In implementations, the apparatus may further include: a parameter determination module adapted to determine the following parameters: a number K of data block fragments obtained by encoding any data block using the erasure coding, a number M of check fragments obtained by encoding the any data block using the erasure coding, and a reliability parameter N in a process of writing the any data block, wherein K and M are positive integers, and N is an integer greater than or equal to 0 and less than or equal to M.

In implementations, the present disclosure further provides a data storage system, which includes: a storage client and at least two storage nodes, wherein: the storage client is adapted to encode a data block using an erasure coding to obtain corresponding multiple data fragments; separately write the multiple data fragments to corresponding allocated storage nodes; and determine that writing of the data block is successful if a number of storage nodes to which data fragments is successfully written within a first defined time duration is greater than or equal to a defined value, wherein the defined value is greater than or equal to a number of data block fragments in the multiple data fragments and is less than or equal to a number of the multiple data fragments.

In implementations, the storage client may be further adapted to asynchronously rewrite data fragments that are not successfully written to storage nodes after determining that the data block is successfully written.

In implementations, the system may further include: a storage management node adapted to receive a storage node allocation request of the storage client, and allocate storage node(s) for storing the data fragments to the storage client according to the storage node allocation request.

In implementations, the present disclosure further provides a computing device, which includes a memory and a processor, wherein the memory is adapted to store a data storage program, and the data storage program, when executed by the processor, implements the operations of the data storage method provided in the first aspect.

In implementations, the present disclosure further provides a computer-readable medium that stores a data storage program, and the data storage program, when executed by a processor, implements the operations of the data storage method provided in the first aspect.

In the embodiments of the present disclosure, EC encoding is performed on a data block to obtain corresponding multiple data fragments. The multiple data fragments are separately written to corresponding allocated storage nodes. If a number of storage nodes to which data fragments are successfully written within a first defined time duration is greater than or equal to a defined value, a determination is made that writing of the data block is successful. The defined value is greater than or equal to a number of data block fragments in the data fragments and is less than or equal to a number of data fragments. In the embodiments of the present disclosure, it is possible to tolerate an occurrence of failures in some storage nodes during a process of writing a data block. Even if failures occurs in some storage nodes, a determination can still be made that the data block is written successfully; in this way, a delay in data writing is reduced and the performance stability of storage nodes is improved when a failure occurs.

Apparently, any product implementing the present disclosure does not necessarily need to achieve all the above advantages at the same time.

DETAILED DESCRIPTION

The embodiments of the present disclosure are described in detail hereinafter with reference to the drawings. It should be understood that the embodiments described below are only used for describing and explaining the present disclosure, and are not intended to limit the present disclosure.

It should be noted that, if no conflict exists, the embodiments of the present disclosure and various features in the embodiments can be combined with each other, which are all included in the scope of protection of the present disclosure. In addition, although a logical order is shown in a flowchart, in some cases, operations may be performed in an order different from that that is shown or described herein.

In implementations, a computing device that executes a data storage method may include one or more processors (CPUs), input/output interfaces, network interfaces, and memory.

The memory may include a form of computer readable media such as a volatile memory, a random access memory (RAM) and/or a non-volatile memory, for example, a read-only memory (ROM) or a flash RAM. The memory is an example of a computer readable media. The memory may include module 1, module 2, . . . , module N (N is an integer greater than 2).

The computer readable media may include a volatile or non-volatile type, a removable or non-removable media, which may achieve storage of information using any method or technology. The information may include a computer readable instruction, a data structure, a program module or other data. Examples of computer readable media include, but not limited to, phase-change memory (PRAM), static random access memory (SRAM), dynamic random access memory (DRAM), other types of random-access memory (RAM), read-only memory (ROM), electronically erasable programmable read-only memory (EEPROM), quick flash memory or other internal storage technology, compact disk read-only memory (CD-ROM), digital versatile disc (DVD) or other optical storage, magnetic cassette tape, magnetic disk storage or other magnetic storage devices, or any other non-transmission media, which may be used to store information that may be accessed by a computing device. As defined herein, the computer readable media does not include transitory media, such as modulated data signals and carrier waves.

The embodiments of the present disclosure provide data storage method, apparatus, and system, which can reduce a data writing delay and improve performance stability when a malfunction occurs in a storage node. In particular, in a direct-write EC scenario, if some storage nodes involved in a write process are abnormal and a failure of guaranteeing that all storage nodes are successfully written is resulted, a write success can be returned, thereby reducing a processing delay in the direct-write EC and improving performance stability.

Figure 1:
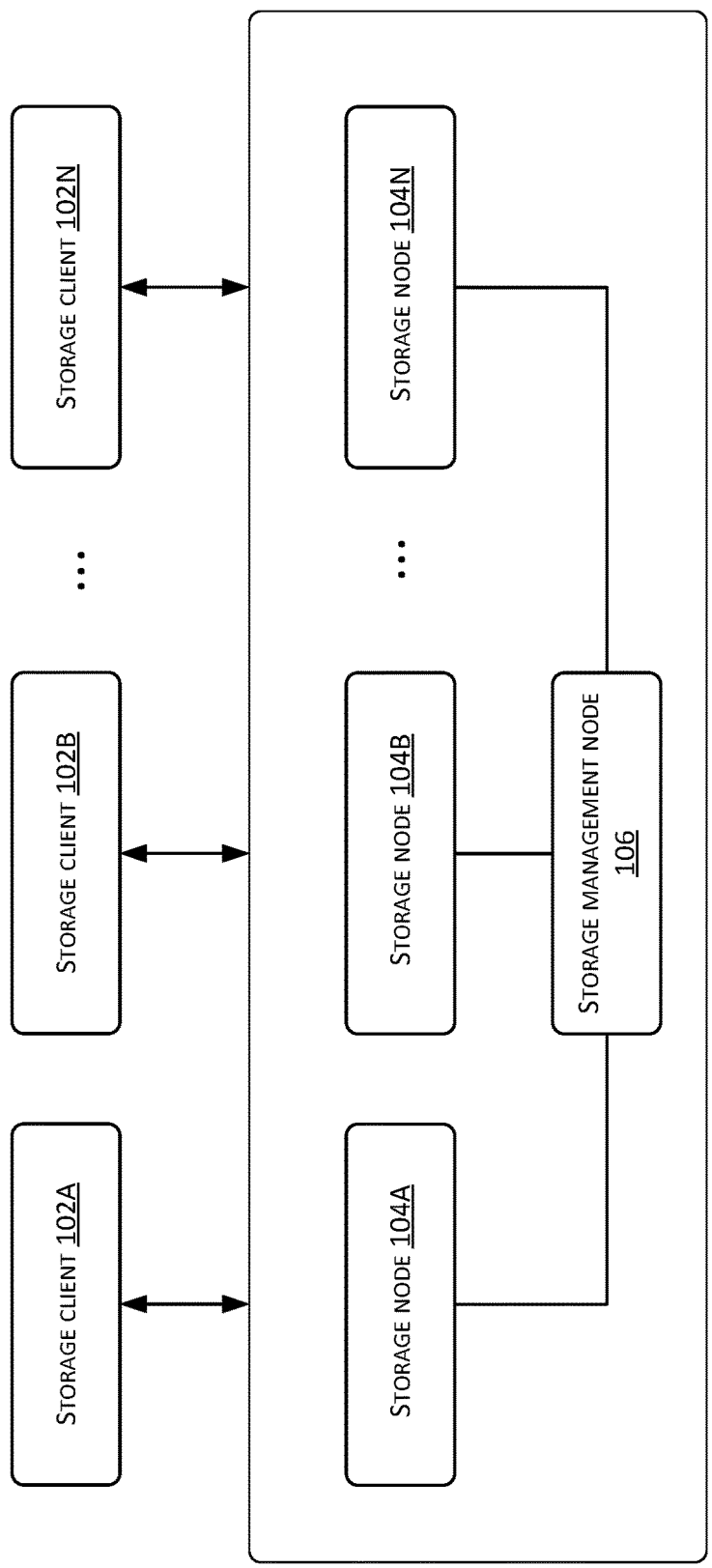
FIG. 1 is a schematic diagram of a data storage system provided by the embodiments of the present disclosure.

FIG. 1 is a schematic diagram of a data storage system 100 provided by the embodiments of the present disclosure. As shown in FIG. 1, the data storage system 100 may storage clients (for example, storage clients 102a, 102b, and 102n) and multiple storage nodes (for example, storage nodes 104a, 104b, and 104n). The storage clients connect to the storage nodes.

The data storage system 100 may be a distributed storage system. The storage client may be a logical function module deployed on a terminal device, and responsible for determining a data block for writing to storage node(s), writing the data block to the storage node(s), and returning to a result of whether the data block was successfully written to a user or the terminal device. The storage node is suitable for storing data blocks. The storage node may be a physical storage node or multiple logical storage nodes divided by a physical storage node. Nevertheless, the present disclosure is not limited thereto.

As shown in FIG. 1, the data storage system 100 may further include: a storage management node 106 connected to the multiple storage nodes, the storage management node 106 being adapted to receive a storage node allocation request from a storage client and allocate storage nodes for storing data fragments to the storage client according to the storage node allocation request.

In implementations, after determining that a data block needs to be written to storage nodes, a storage client (for example, the storage client 102a) sends a storage node allocation request to the storage management node 106. The storage node allocation request may include a relevant parameter associated with EC encoding. After the receiving the storage node allocation request, storage management node 106 may determine the storage nodes that are allocated to the storage client for storing data fragments according to a defined storage node allocation strategy. The storage management node 106 returns information of the allocated storage nodes to the storage client. The storage client may then write data fragments that are obtained by the EC encoding of the data block to these storage nodes. The present disclosure has no limitation on the storage node allocation strategy.

In implementations, for multiple data fragments of a data block, one data fragment is written to one storage node. Therefore, the number of storage nodes allocated by the storage management node 106 to a storage client can be determined according to the number of data fragments generated by EC encoding of a data block.

A Reed-Solomon algorithm for EC encoding is used as an example. Encoding parameters may be (K, M), which determines the cost of storage, where (K+M)/K is an efficiency of storage. For example, if K=8, M=4, the efficiency of storage is 1.5. K represents the number of data block fragments obtained by EC encoding of any data block. M represents the number of check fragments obtained by EC encoding of any data block. K and M are positive integers. In this example, after a data block is EC encoded, K data block fragments and M check fragments can be obtained, i.e., a total of K+M data fragments. In this case, the storage management node 106 can allocate K+M storage nodes to the storage client. M determines a maximum tolerable number of storage nodes that can be down for a complete data block without losing data. In other words, when less than or equal to M data fragments of K+M data fragments are lost, data in these lost data fragments can still be recovered.

In implementations, a storage client (for example, the storage client 102a) is adapted to perform EC encoding on a data block to obtain corresponding multiple data fragments; write the multiple data fragments to corresponding allocated storage nodes; and determine that writing of the data block is successful if a number of storage nodes to which data fragments is successfully written within a first defined time duration is greater than or equal to a defined value, wherein the defined value is greater than or equal to a number of data block fragments in the multiple data fragments and is less than or equal to a number of the multiple data fragments. A Reed-Solomon algorithm for EC encoding and encoding parameters (K, M) are used as an example. In this example, the defined value can be greater than or equal to K and less than or equal to K+M. In other words, when a malfunction occurs in some storage nodes, the storage client can still determine that the data block was written successfully, such as a write success of data block is returned to the user or terminal device.

The first defined time duration can be determined according to an empirical value or a statistical value of an average of timeouts for writing a data fragment in a storage node to in corresponding scenarios, which is, however, not limited by the present disclosure.

In implementations, the storage client can also configure a reliability parameter N during writing of any data block. N is used to determine a maximum tolerable number of storage nodes that can be down during a process of writing any data block under a condition that the writing of the data block is determined to be successful and no data is lost. N is an integer greater than or equal to 0 and less than or equal to M. Specifically, the defined value may be K+N. In other words, during a process of writing any data block, when less than or equal to N data fragments among K+M data fragments are lost, a determination can be made that the writing of such data block is successful.

In implementations, for a process of writing K+M data fragments of a data block, if the number of storage nodes to which data fragments are successfully written is K+N, a determination is made that the data block is successfully written. Therefore, a tolerable number of nodes that are down during the process of writing may be M-N. The larger N is, the higher the data reliability is, and the smaller the number of nodes that are allowed to be down in the writing process is. The smaller N is, the lower the data reliability is, and the larger the number of nodes that are allowed to be down in the writing process is.

In implementations, the storage client may be further adapted to asynchronously rewrite data fragments that are not successfully written to storage nodes after determining that the writing of the data block is successful.

In implementations, the storage client may be adapted to asynchronously rewrite the data fragments that were not successfully written to the storage nodes in the following manner:

rewriting the data fragments to the storage nodes to which the data fragments were not successfully written;

updating the number of storage nodes to which the data fragments are successfully written if the rewriting is successful; and performing a seal operation on the data block, marking the data block as read-only, and perform data reconstruction and recovery on the data block through a storage management node, if the rewriting fails.

The seal operation may include: persisting a read-only mark of the data block to the storage management node, so that the data block is marked as read-only, and subsequent update of the data block is not allowed.

In this example, when some storage nodes are abnormal and the storage client still determines that the writing of the data block is successful, asynchronous write processing is performed on the data fragments that have not been successfully written to ensure that the writing of the data block is completed.

In implementations, the storage client may also be adapted to perform a seal operation on the data block and mark the data block as read-only if the number of storage nodes to which the data fragments are successfully written within the first defined time duration is less than the defined value; allocate a new data block, and determine a plurality of corresponding data fragments obtained after encoding the new data block using the erasure coding, wherein data content included in the new data block is identical to data content included by the data block marked as read-only; and separately write the plurality of corresponding data fragments of the new data block to newly allocated storage nodes.

In this example, when the number of data fragments that have not been successfully written to storage nodes is relatively large, the storage management node may be requested to reallocate new storage nodes, and the storage client may then write a newly allocated data block to the newly allocated storage nodes.

In implementations, the storage client may also be adapted to determine that the writing of the data block fails if a number of storage nodes to which the data fragments are successfully written within a second defined time duration is less than the defined value, for example, returning a write failure of data block to a user or terminal, wherein the second defined time duration is greater than the first defined time duration.

In this example, the second set duration may be determined according to a maximum timeout duration for the storage client to return a write result to the user. Specifically, when a time duration of a writing process of the storage client reaches the second defined time duration, a write failure is returned if a condition for a write success is still not met.

In implementations, the storage client may be further adapted to determine that the writing of the data block is successful after data fragments that are not successfully written to the storage node are successfully written to allocated backup storage node(s), if the number of storage nodes to which the data fragments is successfully written within the first defined time duration is greater than or equal to the defined value.

In this example, the storage client can also be configured with a number P of backup storage nodes, wherein P is a positive integer. In implementations, when the EC encoding parameters are (K, M), the number of storage nodes allocated to the storage client for storing data fragments by the storage management node 106 may be K+M+P.

Processes of execution of a data storage system will be described below with reference to FIGS. 2 and 3.

Figure 2:
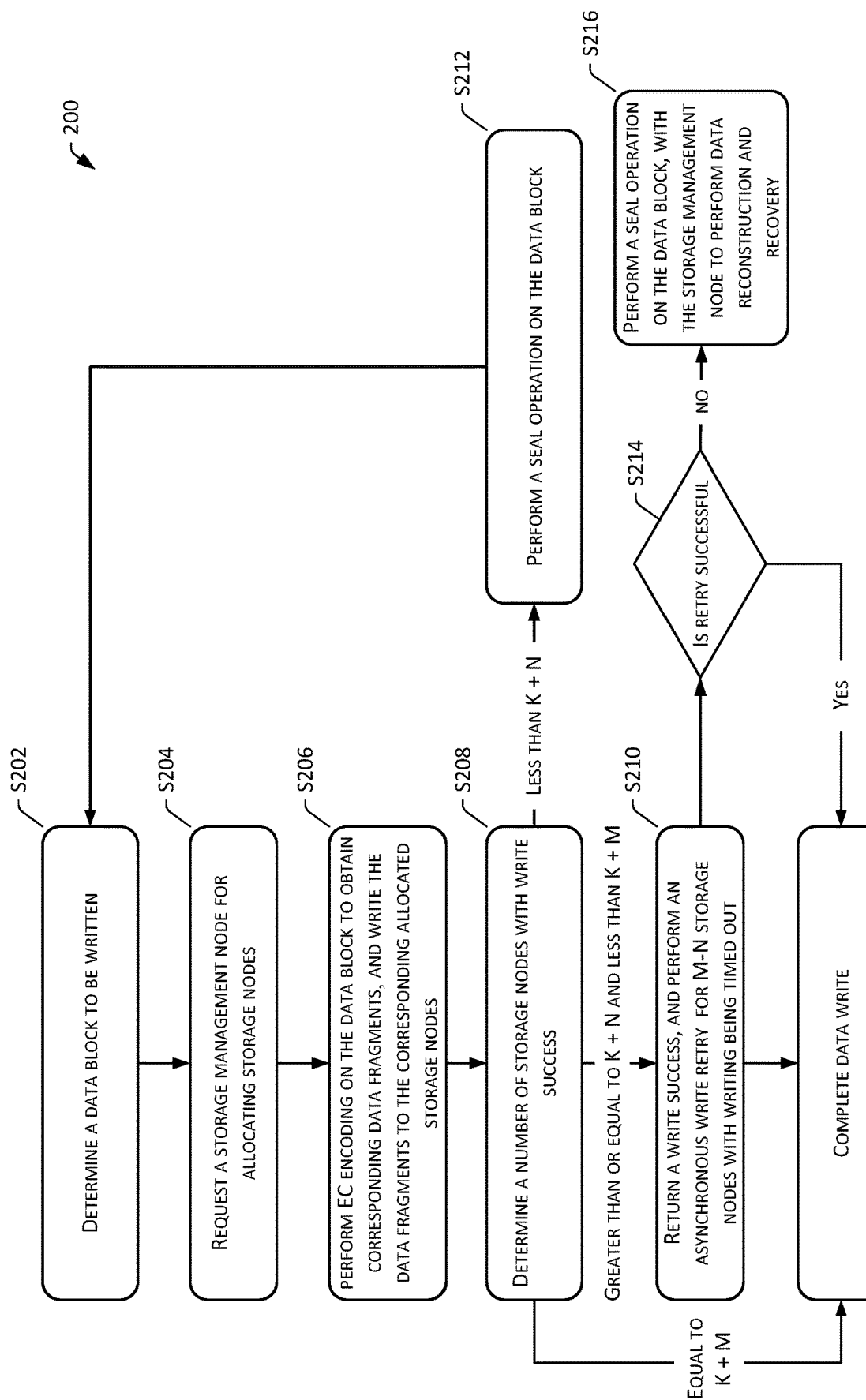
FIG. 2 is a diagram of an example process of execution of a data storage system provided by the embodiments of the present disclosure.

FIG. 2 is a first diagram of an example process of execution 200 of a data storage system provided by the embodiments of the present disclosure. This example uses a process of writing a data block in a direct-write EC scenario as an example. An example of using a Reed-Solomon algorithm for EC and encoding parameters as (K, M) is described. Moreover, in this example, a storage client is configured with a reliability parameter N in a data writing process, which is used to determine a maximum tolerable number of storage nodes that are down during a process of writing a data block under a condition that the writing is determined to be successful and no data is lost.

As shown in FIG. 2, this example includes the following process 200:

S202: A storage client determines a data block to be written for a first time, for example, the storage client determines a user request to be written.

S204: The storage client requests a storage management node for allocating storage nodes.

In this operation, the storage client may send a storage node allocation request to the storage management node, and the storage node allocation request may include encoding parameters (K, M). after receiving the storage node allocation request, the storage management node may determine the number of storage nodes that are needed to be allocated (i.e., K+M), determine which storage nodes are allocated to the storage client according to a defined storage node allocation strategy, and return information of the storage nodes to the storage client. After the storage management node determines the allocated storage nodes, the storage nodes for the data fragments obtained after EC encoding of the data block of the storage client will not be changed in the entire writing process.

S206: The storage client performs EC encoding on the data block to obtain corresponding K+M data fragments, and write the data fragments to the corresponding allocated storage nodes, with one storage node corresponding to writing of one data fragment.

In this example, performing EC encoding on a data block can obtain K data block fragments and M check fragments, wherein the K data block fragments are obtained from the data block, and M check fragments are obtained by performing verification and coding on the K data block fragments through a redundancy algorithm.

S208: The storage client determines a number of storage nodes to which data fragments are successfully written.

In this operation, the storage client may determine a number of write successes in the storage nodes corresponding to the data fragments within a first defined time duration. The first defined time duration may be determined according to an empirical value or a statistical value of an average of timeouts for writing data fragments by storage nodes in direct-write EC scenarios. However, this application is not limited to this.

In this example, if a data fragment is successfully written to a storage node, the storage node will return a response message indicating a write success to the storage client. Otherwise, the storage node returns a response message indicating a write failure or does not return a response message. The storage client determines the number of storage nodes to which data fragments are successfully written based on write success response messages received within the first defined time duration, and then determines whether the writing of the data block is successful based on the number of storage nodes to which the data fragments are successfully written.

In this example, if the storage client determines that the number of storage nodes to which data fragments are successfully written is equal to K+M within the first defined time duration in the writing process, i.e., all data fragments corresponding to the data block are successfully written, the storage client confirms that the writing of the data is completed, and can return a write success to the user. If the storage client determines that the number of storage nodes to which data fragments are successfully written is less than K+M and greater than or equal to K+N within the first defined time duration in the writing process, S210 may be executed. If the storage client determines that the number of storage nodes during is less than K+N within the first defined time duration in the writing process, S212 may be executed.

S210: The storage client determines that the writing of the data block is successful, a write success can be returned to a user, and an asynchronous background write retry is performed for M-N storage nodes with writing being timed out, if the storage client determines that the number of storage nodes to which data fragments are successfully written is less than K+M and greater than or equal to K+N within the first defined time duration in the writing process.

S214: The storage client determines whether the write retry is successful within a certain period of time; a confirmation is made that a data write is completed, i.e., the number of storage nodes having write success returns to K+M if the retry is successful; S216 is executed if the retry is failed, i.e., a seal operation is performed on the data block to ensure that the data block will not have any additional update operations subsequently. The storage management node then performs background rebuild (Rebuild) on the data block and performs data recovery. The storage management node may automatically initiate data reconstruction, and then perform data recovery on the corresponding storage nodes.

A process of the seal operation may be: persisting a read-only mark of the data block to the storage management node of the distributed storage, so that the data block is marked as read-only, and subsequent updates of the data block are not allowed.

S212: If the storage client determines that the number of storage nodes to which the data fragments are successfully written is less than K+N within the first defined time duration in the writing process, this indicates that the currently allocated storage nodes have a high failure rate, and a seal operation is thus performed on the data block in the background to ensure that the data block will not have any subsequent additional update operations, and the process is returned to S202 to execute a new writing process of a new data block, wherein data content of a newly allocated data block is consistent with data content of an original data block that is marked as read-only. In other words, a new writing process is executed on data content that was not successfully written. In the new writing process, the storage management node newly allocate storage nodes to which data fragments are written, and then performs corresponding operation processing according to the number of storage nodes to which data fragments are successfully written.

In this example, if the number of write success among storage nodes is still less than K+N within a second defined time duration, the storage client determines that the writing of the data block fails, and may return a write failure to the user. The second defined time duration may be determined according to a maximum timeout duration for the storage client to return a result to the user. The second defined time duration is greater than the first defined time duration.

In this example, for a data block, if data fragments are successfully written to K+N storage nodes when writing K+M data fragments, the storage client returns a write success to the user. Since K+N is less than or equal to K+M, failures of M−N storage nodes during a writing process is tolerable. Data can be appended asynchronously for storage nodes in which a failure occurs, which thereby greatly reduce the latency associated with a write and ensure the performance stability of a direct-write EC scenario.

Figure 3:
FIG. 3 is a diagram of another example process of execution of a data storage system provided by the embodiments of the present disclosure.

FIG. 3 is a second diagram of an example process 300 of execution of a data storage system provided by the embodiments of the present disclosure. In this example, a process of writing a data block in a direct-write EC scenario is used as an example for description. An example of using a Reed-Solomon algorithm for EC and coding parameters as (K, M) is described. Moreover, in this example, a storage client is configured with a reliability parameter N in a data writing process and a number P of backup storage nodes, where N is used to decide a maximum tolerable number of storage nodes that can be down in a process writing of a data block, under a condition that a write success is confirmed and no data is lost.

As shown in FIG. 3, this example includes the following process 300:

S302: A storage client determines a data block to be written for a first time, for example, the storage client determines a user request to be written.

S304: The storage client requests a storage management node for allocating storage nodes.

In this operation, the storage client may send a storage node allocation request to the storage management node, and the storage node allocation request may include parameters (K, M, P). After receiving the storage node allocation request, the storage management node may determine a number of storage nodes that are to be allocated, i.e., K+M+P, determine which storage nodes are allocated to the storage client according to a defined storage node allocation strategy, and return information of the allocated storage nodes to the storage client. After the storage management node determines the allocated storage nodes, data fragments obtained by EC encoding of the data block of the storage client no longer changes the storage nodes in the entire writing process.

S306: The storage client performs EC encoding on the data block to obtain corresponding K+M data fragments, and write the data fragments to the corresponding allocated storage nodes, one storage node corresponding to writing of one data fragment.

In this example, EC encoding of a data block can obtain K data block fragments and M check fragments, where K data block fragments are obtained from the data block, and M check fragments are obtained by performing verification and coding on the K data block fragments through a redundancy algorithm.

S308: The storage client determines a number of storage nodes to which data fragments are successfully written.

In this example, if the storage client determines that the number of storage nodes to which data fragments are successfully written is equal to K+M within the first defined time duration in the writing process, i.e., all data fragments corresponding to the data block are successfully written, the storage client confirms that the writing of the data is completed, and can return a write success to the user. If the storage client determines that the number of storage nodes to which data fragments are successfully written is less than K+M and greater than or equal to K+N within the first defined time duration in the writing process, S310 may be executed. If the storage client determines that the number of storage nodes during is less than K+N within the first defined time duration in the writing process, S312 may be executed.

For other descriptions of this operation, reference may be made to the description of S208 in FIG. 2, and details thereof are thus not repeatedly described herein.

S310: The storage client writes unsuccessfully written data fragments to additional P backup storage nodes and persistently records metadata of such storage relationship in the storage management node, if the storage client determines that the number of storage nodes to which data fragments are successfully written is less than K+M and greater than or equal to K+N within the first defined time duration in the writing process (i.e., when writing to M−N storage nodes fails due to timeout or malfunction within the first defined time duration); and the storage client determines that writing of the data block is successful, and can return a write success to a user after successfully writing to the P backup storage nodes.

In implementations, P may be set to 3. For example, three copies of the unsuccessfully written data fragments are made, and separately stored in three storage nodes. Alternatively, the unsuccessfully written data fragments are sequentially written to three backup storage nodes. The present disclosure does not have any limitation thereon.

For description of S312, reference can be made to S212 in FIG. 2, and is not repeated herein.

Figure 4:
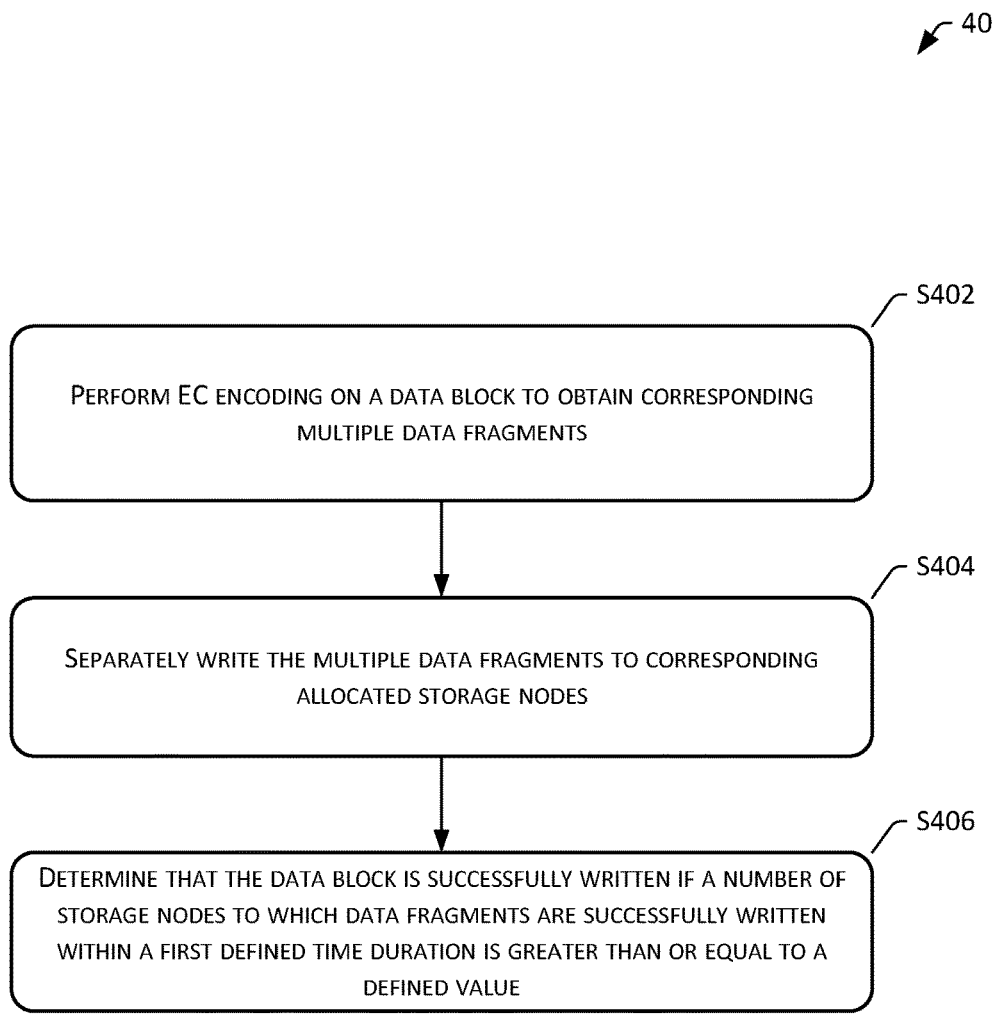
FIG. 4 is a flowchart of a data storage method provided by the embodiments of the present disclosure.

FIG. 4 is a flowchart of a data storage method 400 provided by the embodiments of the present disclosure. As shown in FIG. 4, the data storage method 400 may include the following operations.

S402: Perform EC encoding on a data block to obtain corresponding multiple data fragments.

S404: Separately write the multiple data fragments to corresponding allocated storage nodes.

S406: Determine that the data block is successfully written if a number of storage nodes to which data fragments are successfully written within a first defined time duration is greater than or equal to a defined value, the number of data block fragments being less than or equal to the number of data fragments.

The data storage method 400 may be executed by a storage client in the data storage system.

In implementations, after S406, the data storage method of the present embodiment may further include: asynchronously rewriting data fragments that are not successfully written to storage nodes.

In implementations, asynchronously rewriting the data fragments that are not successfully written to the storage nodes may include:

rewriting the data fragments to the storage nodes to which the data fragments were not successfully written;

updating the number of storage nodes to which the data fragments are successfully written if the rewriting is successful; and performing a seal operation on the data block, marking the data block as read-only, and perform data reconstruction and recovery on the data block through a storage management node, if the rewriting fails.

In implementations, after S404, the data storage method of the present embodiment may further include:

performing a seal operation on the data block and marking the data block as read-only if the number of storage nodes to which the data fragments are successfully written within the first defined time duration is less than the defined value;

allocating a new data block, and determining a plurality of corresponding data fragments obtained after encoding the new data block using the erasure coding, wherein data content included in the new data block is identical to data content included by the data block marked as read-only; and separately writing the plurality of corresponding data fragments of the new data block to newly allocated storage nodes.

In implementations, after S404, the data storage method of the present embodiment may further include: determining that the writing of the data block fails if a number of storage nodes to which the data fragments are successfully written within a second defined time duration is less than the defined value, wherein the second defined time duration is greater than the first defined time duration.

In implementations, S406 may include:

determining that the writing of the data block is successful after data fragments that are not successfully written to the storage node are successfully written to allocated backup storage node(s), if the number of storage nodes to which the data fragments is successfully written within the first defined time duration is greater than or equal to the defined value.

In implementations, before S402, the data storage method of the present embodiment may further include: determining the following parameters: a number K of data block fragments obtained by encoding any data block using the erasure coding, a number M of check fragments obtained by encoding the any data block using the erasure coding, and a reliability parameter N in a process of writing the any data block, wherein K and M are positive integers, and N is an integer greater than or equal to 0 and less than or equal to M.

EC encoding using a Reed-Solomon algorithm is used as an example, and encoding parameters can be (K, M). M determines a maximum tolerable number of storage nodes that can be down for a complete data block without losing data. N determines a maximum tolerable number of storage nodes that can be down in a process writing of any data block, under a condition that a write success is confirmed and no data is lost. N is an integer greater than or equal to 0 and less than or equal to M. That is, the above defined value may be K+N.

In implementations, the above parameters may also include: a number of backup storage nodes.

A relevant description of the data storage method provided by the present embodiment may be referenced to the description of the foregoing system embodiments, and are not repeatedly described herein.

Figure 5:
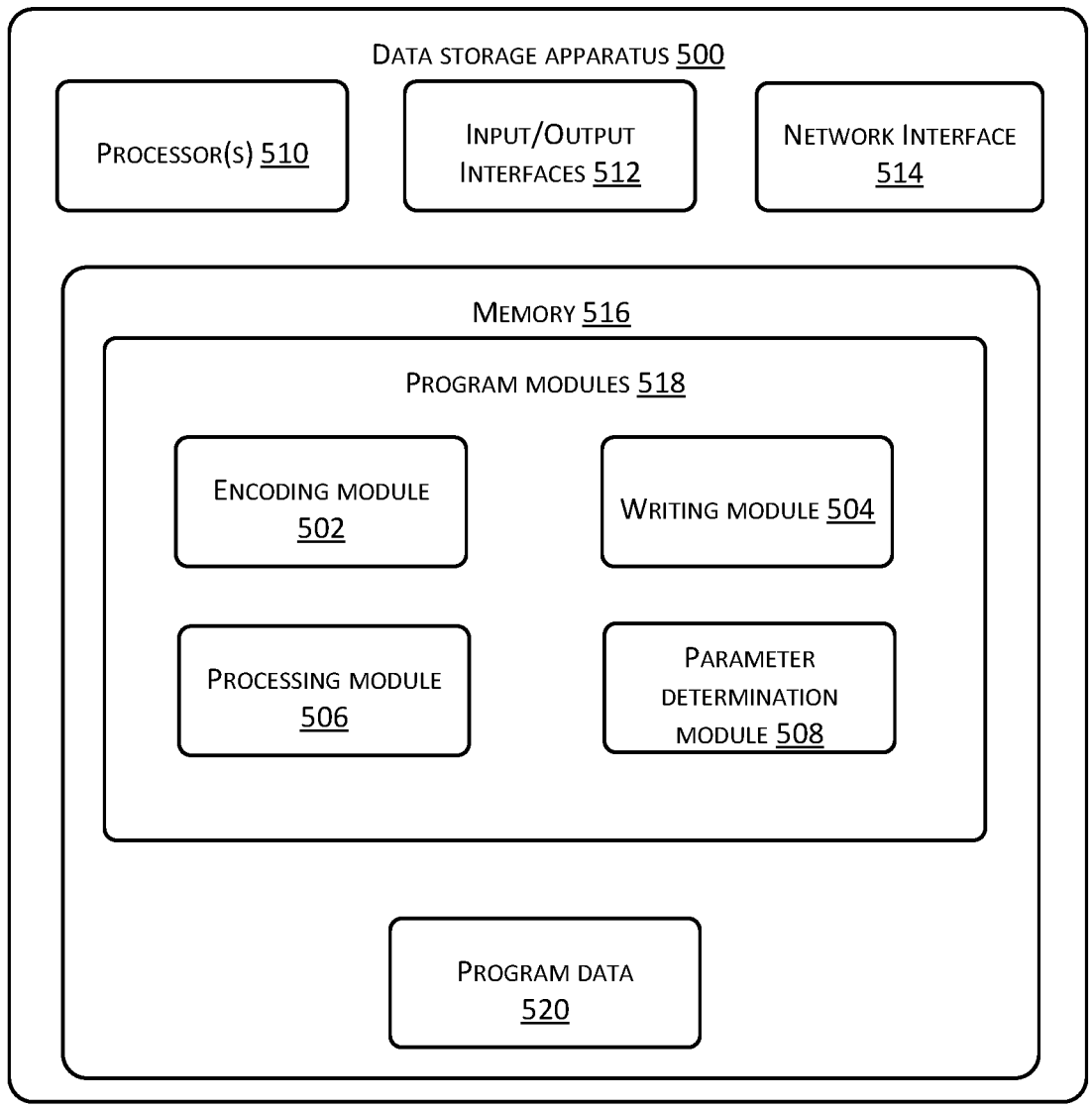
FIG. 5 is a schematic diagram of a data storage apparatus provided by the embodiments of the present disclosure.

FIG. 5 is a schematic diagram of a data storage apparatus 500 provided by the embodiments of the present disclosure. As shown in FIG. 5, the data storage apparatus 500 may include:

an encoding module 502 adapted to encode a data block using an erasure coding to obtain corresponding multiple data fragments;

a writing module 504 adapted to separately write the multiple data fragments to corresponding allocated storage nodes; and a processing module 506 adapted to determine that writing of the data block is successful if a number of storage nodes to which data fragments is successfully written within a first defined time duration is greater than or equal to a defined value, wherein the defined value is greater than or equal to a number of data block fragments in the multiple data fragments and is less than or equal to a number of the multiple data fragments.

In implementations, the processing module 506 may be further adapted to asynchronously rewrite data fragments that are not successfully written to storage nodes after determining that the data block is successfully written.

In implementations, the processing module 506 is further adapted to perform a seal operation on the data block and mark the data block as read-only if the number of storage nodes to which the data fragments are successfully written within the first defined time duration is less than the defined value; allocate a new data block, and determine a plurality of corresponding data fragments obtained after encoding the new data block using the erasure coding, wherein data content included in the new data block is identical to data content included by the data block marked as read-only; and separately write the plurality of corresponding data fragments of the new data block to newly allocated storage nodes.

In implementations, the processing module 506 may be adapted to determine that the writing of the data block is successful after data fragments that are not successfully written to the storage node are successfully written to allocated backup storage node(s), if the number of storage nodes to which the data fragments is successfully written within the first defined time duration is greater than or equal to the defined value.

In implementations, the data storage apparatus 500 may further include: a parameter determination module 508 adapted to determine the following parameters: a number K of data block fragments obtained by encoding any data block using the erasure coding, a number M of check fragments obtained by encoding the any data block using the erasure coding, and a reliability parameter N in a process of writing the any data block, wherein K and M are positive integers, and N is an integer greater than or equal to 0 and less than or equal to M.

In implementations, the data storage apparatus 500 may further include one or more processors 510, an input/output (I/O) interface 512, a network interface 514, and a memory 516. In implementations, the memory 516 may include program modules 518 and program data 520. The program modules 518 may include one or more of the foregoing modules as described in FIG. 5.

The memory 516 may include a form of computer-readable media such as a volatile memory, a random access memory (RAM) and/or a non-volatile memory, for example, a read-only memory (ROM) or a flash RAM. The memory 516 is an example of a computer-readable media as described in the foregoing description.

A relevant description of the data storage apparatus may be referenced to the description of the foregoing method and system embodiments, and are not repeatedly described herein.

Figure 6:
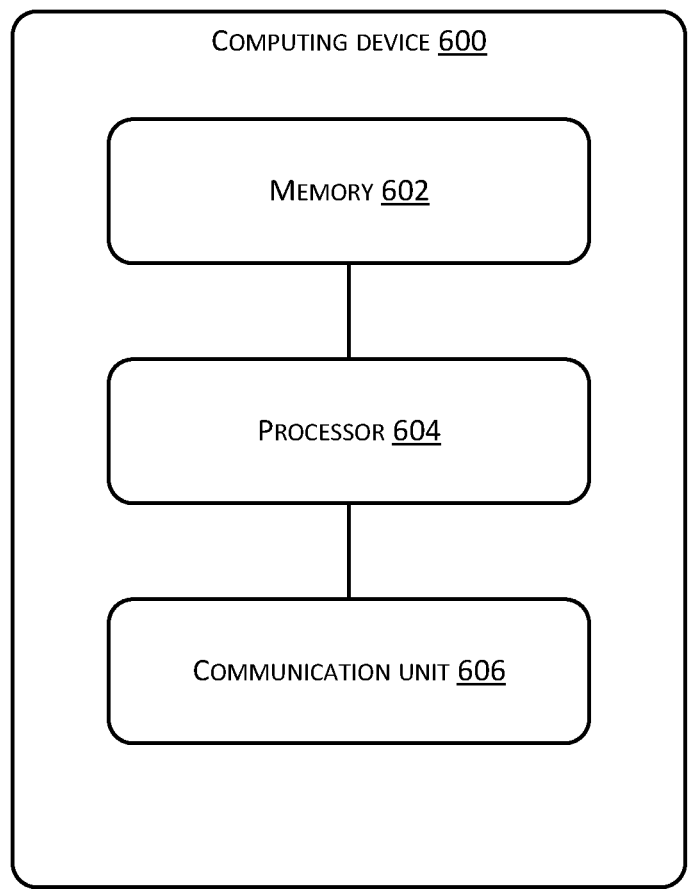
FIG. 6 is a schematic diagram of a computing device provided by the embodiments of the present disclosure.

FIG. 6 is a schematic diagram of a computing device 600 provided by the embodiments of the present disclosure. As shown in FIG. 6, the computing device 600 may include a memory 602 and a processor 604. The memory 602 is adapted to store a data storage program, and the data storage program, when executed by the processor 604, implements the operations of the data storage method provided in the embodiments corresponding to FIG. 4.

The processor 604 may include, but is not limited to, a processing device such as a microprocessor (MCU, Microcontroller Unit) or a programmable logic device (FPGA, Field Programmable Gate Array). The memory 602 may be configured to store software programs and modules of application software, such as program instructions or modules corresponding to the data storage methods in implementations. The processor 604 executes various functions, applications, and data processing by running the software programs and modules stored in the memory 602, i.e., to realize the above data storage methods. The memory 602 may include a high-speed random access memory, and may also include a non-volatile memory, such as one or more magnetic storage devices, flash memory, or other non-volatile solid-state memory. In some examples, the memory 602 may include storage devices remotely deployed with respect to the processor 604, and these remote storage devices may be connected to the computing device 600 through a network. Examples of the network include, but are not limited to, the Internet, intranet, a local area network, a mobile communication network, and a combination thereof.

In implementations, the computing device 600 may further include a communication unit 606, and the communication unit 606 may receive or send data via a network. In an example, the communication unit 606 may be a radio frequency (Radio Frequency, RF for short) module, which is used for wirelessly communicating with the Internet.

In addition, the embodiments of the present disclosure further provide a computer-readable medium that stores a data storage program, and when the data storage program is executed by a processor, the operations of the data storage method(s) are implemented.

One of ordinary skill in the art may understand that all or some of the operations in the methods, and functional modules/units in the systems and apparatuses disclosed above may be implemented as software, firmware, hardware, and an appropriate combination thereof. In a hardware implementation, a division of functional modules/units mentioned in the above description does not necessarily correspond to a division of physical components. For example, a physical component may have multiple functions, or a function or operation may be executed cooperatively by a number of physical components. Some or all of the components may be implemented as software executed by a processor, such as a digital signal processor or microprocessor, or implemented as hardware, or implemented as an integrated circuit, such as an application specific integrated circuit. Such software may be distributed on computer-readable medium.

The basic principles and main features of the present disclosure and the advantages of the present disclosure are shown and described above. The present disclosure is not limited by the foregoing embodiments. The foregoing embodiments and the descriptions thereof only illustrate the principles of the present disclosure. Without departing from the spirit and scope of the present disclosure, various changes and improvements exist in the present disclosure. These changes and improvements fall within the scope of protection of the present disclosure.

The present disclosure can be further understood using the following clauses.

Clause 1: A data storage method comprising: encoding a data block using an erasure coding to obtain corresponding multiple data fragments; separately writing the multiple data fragments to corresponding allocated storage nodes; and determining that writing of the data block is successful if a number of storage nodes to which data fragments is successfully written within a first defined time duration is greater than or equal to a defined value, wherein the defined value is greater than or equal to a number of data block fragments in the multiple data fragments and is less than or equal to a number of the multiple data fragments.

Clause 2: The method of Clause 1, wherein: after determining that the data block is successfully written, the method further comprises: asynchronously rewriting data fragments that are not successfully written to storage nodes.

Clause 3: The method of Clause 2, wherein the asynchronous rewriting data fragments that are not successfully written to the storage nodes comprises: rewriting the data fragments to the storage nodes to which the data fragments were not successfully written; updating the number of storage nodes to which the data fragments are successfully written if the rewriting is successful; and performing a seal operation on the data block, marking the data block as read-only, and perform data reconstruction and recovery on the data block through a storage management node, if the rewriting fails.

Clause 4: The method of Clause 1, wherein: after separately writing the multiple data fragments to the corresponding allocated storage nodes, the method further comprises: performing a seal operation on the data block and marking the data block as read-only if the number of storage nodes to which the data fragments are successfully written within the first defined time duration is less than the defined value; allocating a new data block, and determining a plurality of corresponding data fragments obtained after encoding the new data block using the erasure coding, wherein data content included in the new data block is identical to data content included by the data block marked as read-only; and separately writing the plurality of corresponding data fragments of the new data block to newly allocated storage nodes.

Clause 5: The method of Clause 1, wherein after separately writing the multiple data fragments to the corresponding allocated storage nodes, the method further comprises: determining that the writing of the data block fails if a number of storage nodes to which the data fragments are successfully written within a second defined time duration is less than the defined value, wherein the second defined time duration is greater than the first defined time duration.

Clause 6: The method of Clause 1, wherein determining that the writing of the data block is successful if the number of storage nodes to which the data fragments is successfully written within the first defined time duration is greater than or equal to the defined value comprises: determining that the writing of the data block is successful after data fragments that are not successfully written to the storage node are successfully written to allocated backup storage nodes, if the number of storage nodes to which the data fragments is successfully written within the first defined time duration is greater than or equal to the defined value.

Clause 7: The method of Clause 1, wherein before encoding the data block using the erasure coding to obtain the corresponding multiple data fragments, the method further comprises: determining the following parameters: a number K of data block fragments obtained by encoding any data block using the erasure coding, a number M of check fragments obtained by encoding the any data block using the erasure coding, and a reliability parameter N in a process of writing the any data block, wherein K and M are positive integers, and N is an integer greater than or equal to 0 and less than or equal to M.

Clause 8: The method of Clause 1, wherein the parameters further comprise: a number of backup storage nodes.

Clause 9: A data storage apparatus comprising: an encoding module adapted to encode a data block using an erasure coding to obtain corresponding multiple data fragments; a writing module adapted to separately write the multiple data fragments to corresponding allocated storage nodes; and a processing module adapted to determine that writing of the data block is successful if a number of storage nodes to which data fragments is successfully written within a first defined time duration is greater than or equal to a defined value, wherein the defined value is greater than or equal to a number of data block fragments in the multiple data fragments and is less than or equal to a number of the multiple data fragments.

Clause 10: The apparatus of Clause 9, wherein the processing module is further adapted to asynchronously rewrite data fragments that are not successfully written to storage nodes after determining that the data block is successfully written.

Clause 11: The apparatus of Clause 9, wherein the processing module is further adapted to perform a seal operation on the data block and mark the data block as read-only if the number of storage nodes to which the data fragments are successfully written within the first defined time duration is less than the defined value; allocate a new data block, and determine a plurality of corresponding data fragments obtained after encoding the new data block using the erasure coding, wherein data content included in the new data block is identical to data content included by the data block marked as read-only; and separately write the plurality of corresponding data fragments of the new data block to newly allocated storage nodes.

Clause 12: The apparatus of Clause 9, wherein the processing module is further adapted to determine that the writing of the data block is successful after data fragments that are not successfully written to the storage node are successfully written to allocated backup storage node(s), if the number of storage nodes to which the data fragments is successfully written within the first defined time duration is greater than or equal to the defined value.

Clause 13: The apparatus of Clause 9, wherein the apparatus further comprises: a parameter determination module adapted to determine the following parameters: a number K of data block fragments obtained by encoding any data block using the erasure coding, a number M of check fragments obtained by encoding the any data block using the erasure coding, and a reliability parameter N in a process of writing the any data block, wherein K and M are positive integers, and N is an integer greater than or equal to 0 and less than or equal to M.

Clause 14: A data storage system comprising: a storage client and at least two storage nodes, wherein: the storage client is adapted to encode a data block using an erasure coding to obtain corresponding multiple data fragments; separately write the multiple data fragments to corresponding allocated storage nodes; and determine that writing of the data block is successful if a number of storage nodes to which data fragments is successfully written within a first defined time duration is greater than or equal to a defined value, wherein the defined value is greater than or equal to a number of data block fragments in the multiple data fragments and is less than or equal to a number of the multiple data fragments.

Clause 15: The system of Clause 14, wherein the storage client is further adapted to asynchronously rewrite data fragments that are not successfully written to storage nodes after determining that the data block is successfully written.

Clause 16: The system of Clause 14, wherein the system further comprises: a storage management node adapted to receive a storage node allocation request of the storage client, and allocate storage node(s) for storing the data fragments to the storage client according to the storage node allocation request.

Clause 17: A computing device comprising: a memory and a processor, wherein the memory is adapted to store a data storage program, and the data storage program, when executed by the processor, implements the data storage method of any one of Clauses 1-8.

Clause 18: A computer-readable medium storing a data storage program, wherein the data storage program, when executed by a processor, implements the data storage method of any one of Clauses 1-8.

What is claimed is:

1. A method implemented by a computing device, the method comprising:
   encoding a data block using an erasure coding to obtain corresponding multiple data fragments, the multiple data fragments comprising data block fragments and check fragments;
   separately writing the multiple data fragments to corresponding allocated storage nodes; and
   determining that writing of the data block is successful if a number of storage nodes to which data fragments is successfully written within a first defined time duration is greater than or equal to a defined value, wherein the defined value is greater than or equal to a number of the data block fragments and less than or equal to a number of the multiple data fragments.

2. The method of claim 1, wherein: after determining that the data block is successfully written, the method further comprises: asynchronously rewriting data fragments that are not successfully written to storage nodes.

3. The method of claim 2, wherein the asynchronous rewriting data fragments that are not successfully written to the storage nodes comprises:
   rewriting the data fragments to the storage nodes to which the data fragments were not successfully written;
   updating the number of storage nodes to which the data fragments are successfully written if the rewriting is successful; and
   performing a seal operation on the data block, marking the data block as read-only, and perform data reconstruction and recovery on the data block through a storage management node, if the rewriting fails.

4. The method of claim 1, wherein: after separately writing the multiple data fragments to the corresponding allocated storage nodes, the method further comprises:
   performing a seal operation on the data block and marking the data block as read-only if the number of storage nodes to which the data fragments are successfully written within the first defined time duration is less than the defined value;
   allocating a new data block, and determining a plurality of corresponding data fragments obtained after encoding the new data block using the erasure coding, wherein data content included in the new data block is identical to data content included by the data block marked as read-only; and
   separately writing the plurality of corresponding data fragments of the new data block to newly allocated storage nodes.

5. The method of claim 1, wherein after separately writing the multiple data fragments to the corresponding allocated storage nodes, the method further comprises:
   determining that the writing of the data block fails if a number of storage nodes to which the data fragments are successfully written within a second defined time duration is less than the defined value, wherein the second defined time duration is greater than the first defined time duration.

6. The method of claim 1, wherein determining that the writing of the data block is successful if the number of storage nodes to which the data fragments is successfully written within the first defined time duration is greater than or equal to the defined value comprises:
   determining that the writing of the data block is successful after data fragments that are not successfully written to the storage node are successfully written to allocated backup storage nodes, if the number of storage nodes to which the data fragments is successfully written within the first defined time duration is greater than or equal to the defined value.

7. The method of claim 1, wherein before encoding the data block using the erasure coding to obtain the corresponding multiple data fragments, the method further comprises determining a plurality of parameters, the plurality of parameters comprising one or more of:
   a number K of data block fragments obtained by encoding any data block using the erasure coding, a number M of check fragments obtained by encoding the any data block using the erasure coding, and a reliability parameter N in a process of writing the any data block, wherein K and M are positive integers, and N is an integer greater than or equal to 0 and less than or equal to M.

8. The method of claim 1, wherein the parameters further comprise: a number of backup storage nodes.

9. An apparatus comprising:
one or more processors;
memory;
an encoding module stored in the memory and executed by the one or more processors to encode a data block using an erasure coding to obtain corresponding multiple data fragments, the multiple data fragments comprising data block fragments and check fragments;
a writing module stored in the memory and executed by the one or more processors to separately write the multiple data fragments to corresponding allocated storage nodes; and
a processing module stored in the memory and executed by the one or more processors to determine that writing of the data block is successful if a number of storage nodes to which data fragments is successfully written within a first defined time duration is greater than or equal to a defined value, wherein the defined value is greater than or equal to a number of the data block fragments in the multiple data fragments and less than or equal to a number of the multiple data fragments.

10. The apparatus of claim 9, wherein the processing module is further adapted to asynchronously rewrite data fragments that are not successfully written to storage nodes after determining that the data block is successfully written.

11. The apparatus of claim 9, wherein the processing module is further adapted to perform a seal operation on the data block and mark the data block as read-only if the number of storage nodes to which the data fragments are successfully written within the first defined time duration is less than the defined value; allocate a new data block, and determine a plurality of corresponding data fragments obtained after encoding the new data block using the erasure coding, wherein data content included in the new data block is identical to data content included by the data block marked as read-only; and separately write the plurality of corresponding data fragments of the new data block to newly allocated storage nodes.

12. The apparatus of claim 9, wherein the processing module is further adapted to determine that the writing of the data block is successful after data fragments that are not successfully written to the storage node are successfully written to allocated backup storage node(s), if the number of storage nodes to which the data fragments is successfully written within the first defined time duration is greater than or equal to the defined value.

13. The apparatus of claim 9, wherein the apparatus further comprises: a parameter determination module adapted to determine a plurality of parameters, the plurality of parameters comprising one or more of: a number K of data block fragments obtained by encoding any data block using the erasure coding, a number M of check fragments obtained by encoding the any data block using the erasure coding, and a reliability parameter N in a process of writing the any data block, wherein K and M are positive integers, and N is an integer greater than or equal to 0 and less than or equal to M.

14. One or more computer readable media storing executable instructions that, when executed by one or more processors, cause the one or more processors to perform acts comprising:
encoding a data block using an erasure coding to obtain corresponding multiple data fragments, the multiple data fragments comprising data block fragments and check fragments;
separately writing the multiple data fragments to corresponding allocated storage nodes; and
determining that writing of the data block is successful if a number of storage nodes to which data fragments is successfully written within a first defined time duration is greater than or equal to a defined value, wherein the defined value is greater than or equal to a number of the data block fragments and less than or equal to a number of the multiple data fragments.

15. The one or more computer readable media of claim 14, wherein: after determining that the data block is successfully written, the acts further comprise:
asynchronously rewriting data fragments that are not successfully written to storage nodes.

16. The one or more computer readable media of claim 15, wherein the asynchronous rewriting data fragments that are not successfully written to the storage nodes comprises:
rewriting the data fragments to the storage nodes to which the data fragments were not successfully written;
updating the number of storage nodes to which the data fragments are successfully written if the rewriting is successful; and
performing a seal operation on the data block, marking the data block as read-only, and perform data reconstruction and recovery on the data block through a storage management node, if the rewriting fails.

17. The one or more computer readable media of claim 14, wherein: after separately writing the multiple data fragments to the corresponding allocated storage nodes, the acts further comprise:
performing a seal operation on the data block and marking the data block as read-only if the number of storage nodes to which the data fragments are successfully written within the first defined time duration is less than the defined value;
allocating a new data block, and determining a plurality of corresponding data fragments obtained after encoding the new data block using the erasure coding, wherein data content included in the new data block is identical to data content included by the data block marked as read-only; and
separately writing the plurality of corresponding data fragments of the new data block to newly allocated storage nodes.

18. The one or more computer readable media of claim 14, wherein after separately writing the multiple data fragments to the corresponding allocated storage nodes, the acts further comprise:
determining that the writing of the data block fails if a number of storage nodes to which the data fragments are successfully written within a second defined time duration is less than the defined value, wherein the second defined time duration is greater than the first defined time duration.

19. The one or more computer readable media of claim 14, wherein determining that the writing of the data block is successful if the number of storage nodes to which the data fragments is successfully written within the first defined time duration is greater than or equal to the defined value comprises:
determining that the writing of the data block is successful after data fragments that are not successfully written to the storage node are successfully written to allocated backup storage nodes, if the number of storage nodes to which the data fragments is successfully written within the first defined time duration is greater than or equal to the defined value.

20. The one or more computer readable media of claim 14, wherein before encoding the data block using the erasure coding to obtain the corresponding multiple data fragments, the acts further comprise determining a plurality of parameters, the plurality of parameters comprising one or more of:
a number K of data block fragments obtained by encoding any data block using the erasure coding, a number M of check fragments obtained by encoding the any data block using the erasure coding, and a reliability parameter N in a process of writing the any data block, or a number of backup storage nodes, wherein K and M are positive integers, and N is an integer greater than or equal to 0 and less than or equal to M.

* * * * *